United States Patent
Baker et al.

(10) Patent No.: US 10,877,373 B2
(45) Date of Patent: Dec. 29, 2020

(54) IMAGE OFFSETTING APPARATUSES, SYSTEMS, AND METHODS

(71) Applicants: John L. Baker, Sheridan, IL (US); Jacob D. Baker, Sheridan, IL (US)

(72) Inventors: John L. Baker, Sheridan, IL (US); Jacob D. Baker, Sheridan, IL (US)

(*) Notice: Subject to any disclaimer, the term of this patent is extended or adjusted under 35 U.S.C. 154(b) by 0 days.

(21) Appl. No.: 16/459,739

(22) Filed: Jul. 2, 2019

(65) Prior Publication Data
US 2020/0081342 A1    Mar. 12, 2020

Related U.S. Application Data

(60) Provisional application No. 62/693,348, filed on Jul. 2, 2018.

(51) Int. Cl.
| | | |
|---|---|---|
| *G03F 7/023* | (2006.01) | |
| *G02B 17/06* | (2006.01) | |
| *G02B 23/10* | (2006.01) | |
| *G02B 23/14* | (2006.01) | |
| *G02B 23/16* | (2006.01) | |
| *G02B 23/04* | (2006.01) | |

(52) U.S. Cl.
CPC ........ *G03F 7/023* (2013.01); *G02B 17/0657* (2013.01); *G02B 17/0663* (2013.01); *G02B 23/04* (2013.01); *G02B 23/10* (2013.01); *G02B 23/14* (2013.01); *G02B 23/16* (2013.01)

(58) Field of Classification Search
CPC . G03F 7/023; G02B 17/0657; G02B 17/0663; G02B 23/04; G02B 23/10; G02B 23/14; G02B 23/16

USPC ............................................. 359/850; 42/118
See application file for complete search history.

(56) References Cited

U.S. PATENT DOCUMENTS

| | | | |
|---|---|---|---|
| 3,749,494 A * | 7/1973 | Hodges | F41G 1/30 356/16 |
| 4,478,513 A | 10/1984 | Skinner et al. | |
| 6,604,316 B1 * | 8/2003 | Custer | F41G 1/40 42/118 |
| 7,137,220 B1 * | 11/2006 | Bradley, Jr. | F41G 1/40 42/119 |
| 7,552,558 B1 | 6/2009 | Ballard | |
| 7,603,804 B2 | 10/2009 | Zaderey et al. | |
| 7,752,798 B2 | 7/2010 | Mayerle | |
| 7,911,690 B2 * | 3/2011 | Chapman | F41G 1/46 359/402 |
| 8,336,776 B2 | 12/2012 | Horvath et al. | |
| 8,353,454 B2 | 1/2013 | Sammut et al. | |
| 8,656,630 B2 | 2/2014 | Sammut et al. | |
| 8,707,608 B2 | 4/2014 | Sammut et al. | |
| 10,180,565 B2 | 1/2019 | Havens et al. | |

(Continued)

FOREIGN PATENT DOCUMENTS

| | | |
|---|---|---|
| GB | 1283325 | 7/1972 |
| WO | 2017180744 | 10/2017 |

*Primary Examiner* — Samir Abdosh
(74) *Attorney, Agent, or Firm* — Shaddock Law Group, PC

(57) ABSTRACT

An image offsetting apparatus for producing an offset image pathway and presenting the offset image pathway to an optic, including at least some of a mirror assembly wherein the mirror assembly comprises a first component mirror and a second component mirror, wherein the mirror assembly is attached or coupled so as to provide the offset image pathway that is offset from a direct image pathway between a target object and the optic.

20 Claims, 5 Drawing Sheets

(56) References Cited

U.S. PATENT DOCUMENTS

| 2003/0010190 | A1 |   | 1/2003 | Sannut et al. |   |
| 2019/0145737 | A1 | * | 5/2019 | Baker | G02B 23/02 42/118 |
| 2020/0081342 | A1 | * | 3/2020 | Baker | G02B 23/16 |

* cited by examiner

IMAGE OFFSETTING APPARATUSES, SYSTEMS, AND METHODS

CROSS-REFERENCE TO RELATED APPLICATIONS

This patent application claims the benefit of U.S. Patent Application Ser. No. 62/693,348, filed Jul. 2, 2018, the entire disclosure of which is incorporated herein by reference.

STATEMENT REGARDING FEDERALLY SPONSORED RESEARCH OR DEVELOPMENT

Not Applicable.

REFERENCE TO SEQUENCE LISTING, A TABLE, OR A COMPUTER PROGRAM LISTING COMPACT DISC APPENDIX

Not Applicable.

NOTICE OF COPYRIGHTED MATERIAL

The disclosure of this patent document contains material that is subject to copyright protection. The copyright owner has no objection to the reproduction by anyone of the patent document or the patent disclosure, as it appears in the Patent and Trademark Office patent file or records, but otherwise reserves all copyright rights whatsoever. Unless otherwise noted, all trademarks and service marks identified herein are owned by the applicant.

BACKGROUND OF THE PRESENT DISCLOSURE

1. Field of the Present Disclosure

The present disclosure relates generally to the field of firearm optics. More specifically, the presently disclosed systems, methods, and/or apparatuses relate to variable range adjusting offset apparatuses and systems and adjustable off axis mirror assemblies.

2. Description of Related Art

Many modern shooting accessories, such as optics, may be attached to a variety of firearms, generally to improve the functionality or usability of those firearms. Known optics include scopes, sights, holographic sights, red dot sights, reflex sights, and the like. These optics may be used wherever firearms or similar weapons may be employed, such as for hunting, law enforcement, military, personal defense, or recreational target shooting. Mounts, such as ring mounts, and quick releases are used to couple an optics to a weapon. For example, a gun may have a scope mount on its action, which may permit an after-market scope to be attached to the gun after it has been purchased. This may improve the user's ability to operate the gun, for example by making it easier for the user to aim the gun at long-distance targets.

These optics or optical systems, referred to herein as "optics", however, have functional and practical limitations. Most scopes or targeting devices have a finite range. Additionally, it is often time consuming or difficult to change or adjust a scope or other targeting devices for close quarters or long range targeting. In some cases, complete removal of the scope and mounting system must take place in order to apply the correct component(s), which can create significant weapon re-sighting issues. This can be increasingly problematic as the target distances increase.

Additionally, most optics require an optical line of sight directly from the firearm to the target, particularly as target distances increase. The barrel and the heat emitted from the barrel or any other forward mounted accessory such as a muzzle, break, suppressor, or the like, may enter the optical path and obstruct or distort the view of the target, negating the capability to make an accurate long range shot.

Any discussion of documents, acts, materials, devices, articles, or the like, which has been included in the present specification is not to be taken as an admission that any or all of these matters form part of the prior art base or were common general knowledge in the field relevant to the present disclosure as it existed before the priority date of each claim of this application.

BRIEF SUMMARY OF THE PRESENT DISCLOSURE

In order to overcome certain of the deficiencies experienced by known optics, the present disclosure is directed to various exemplary embodiments of image offsetting apparatuses for producing an offset image and providing that offset image to an optic. The image offsetting apparatus may be a scope, mirrored device, or other image offsetting apparatus that is mounted on a weapon, such as a rifle, that can allow a user to more accurately acquire, view, range, and shoot targets. By utilizing an image offsetting apparatus of the present disclosure, in conjunction with certain optics, the effective range of the optical targeting device may be substantially increased, for example about 200% or more.

Accordingly, the present disclosure is directed to certain exemplary embodiments of an image offsetting apparatus for producing an offset image. The image offsetting apparatus of the present disclosure can allow a user to more accurately acquire, view, range, and shoot targets by providing an alternate incoming image pathway to the optical targeting device so the barrel or any forward mounted accessory (such as, for example, a muzzle, break, suppressor, or the like) or heat radiating from the barrel or any forward mounted accessory does not distort or obstruct the image entering the optic.

In certain exemplary embodiments, the systems, methods, and apparatuses for adjusting a scope are described. In various exemplary embodiments, the systems, methods, and apparatuses may be a mechanical, optical adjustment. Optical adjustments may be made, for example, vertically and/or horizontally, or anywhere along an x-y axis.

The image offsetting apparatus can be an independent or standalone device or integrated into other optical components and attached to any rail or mount or to any existing component of an optic.

The image offsetting apparatus utilizes a series of mirrors and or lenses to create an alternate or offset image pathway from the target object to the optic. The image offsetting apparatus could be utilized in conjunction with a large variety of aiming devices. Such devices can include, but are not limited to, scopes, night vision optics, red dots, holographic devices, ACOGs, the TARAC, laser targeting devices, iron sights, mechanical devices, and the like.

The image offsetting apparatus can further be applied in layers and/or steps that can allow stepped adjustments for different pathways. Such pathways may allow for the adjusting of the zero of a rifle or reticle in any vertical or horizontal direction. It may further be appreciated that the zero of a rifle can be adjusted in any desired various distance increments by increasing or decreasing the angle of incidence of the mirror and or lens in the exemplary embodiments described herein.

In various exemplary, nonlimiting embodiments, the image offsetting apparatus for producing an offset image comprises a mirror assembly wherein the mirror assembly comprises a first component mirror and a second component mirror, wherein the mirror assembly is attached or coupled so as to provide the offset image pathway that is offset from a direct image pathway between a target object and the optic.

In various exemplary, nonlimiting embodiments, the present disclosure provides an image offsetting apparatus for producing an offset image pathway and presenting the offset image pathway to an optical targeting device, including at least some of a mirror assembly wherein the mirror assembly comprises a first component mirror and a second component mirror, wherein the mirror assembly is attached or coupled so as to provide the offset image pathway that is offset from a direct image pathway between a target object and the optic.

In certain exemplary embodiments, the offset image pathway is provided within a plane that is substantially horizontally offset from the direct image pathway.

In certain exemplary embodiments, a barrel does not intercept the offset image pathway between the target object and the optic.

In certain exemplary embodiments, heat radiating from a barrel does not intercept the offset image pathway between the target object and the optic.

In certain exemplary embodiments, the image offsetting apparatus further comprises one or more lenses aligned with the first component mirror and/or the second component mirror.

In various exemplary, nonlimiting embodiments, the present disclosure provides an image offsetting apparatus for producing an offset image pathway for a target image of a target and providing the offset target image to an optical targeting device, including at least some of a housing having an optical cavity formed therein, wherein the optical cavity extends from an incoming image aperture formed through a first portion of the housing to an outgoing image aperture formed through a second portion of the housing, wherein the housing is positionable between the optical targeting device and a target; at least one first rotationally adjustable component mirror rotatably positioned within at least a portion of the optical cavity; and at least one second rotationally adjustable component mirror rotatably positioned within at least a portion of the optical cavity, wherein a reflective surface of the at least one first rotationally adjustable component mirror is positioned so as to receive the target image through the incoming image aperture and reflect the target image to a reflective surface of the at least one second rotationally adjustable component mirror, and wherein the reflective surface of the at least one second rotationally adjustable component mirror is positioned so as to receive the target image from the reflective surface of the at least one first rotationally adjustable component mirror and reflect the target image through the outgoing image aperture, such that the target image entering the incoming image aperture exits the outgoing image aperture at a determined offset that is offset from and at least substantially parallel to a direct image pathway from the target to the optical targeting device.

In certain exemplary embodiments, a first adjustment knob is attached or coupled to the at least one first rotatably adjustable component mirror and wherein rotational movement of the first adjustment knob results in rotational movement of the at least one first rotatably adjustable component mirror.

In certain exemplary embodiments, a second adjustment knob is attached or coupled to the at least one second rotatably adjustable component mirror and wherein rotational movement of the second adjustment knob results in rotational movement of the at least one second rotatably adjustable component mirror.

In certain exemplary embodiments, rotational adjustment of the at least one first rotationally adjustable component mirror adjusts an angle at which the target image is reflected through the outgoing image aperture.

In certain exemplary embodiments, rotational adjustment of the at least one second rotationally adjustable component mirror adjusts an angle at which the target image is reflected through the outgoing image aperture.

In certain exemplary embodiments, the at least one first rotationally adjustable component mirror is attached or coupled to a first adjustable mirror holder and/or the at least one second rotationally adjustable component mirror is attached or coupled to a second adjustable mirror holder.

In certain exemplary embodiments, the at least one first rotationally adjustable component mirror and/or the at least one second rotatably adjustable component mirror is a plane mirror or a magnifying mirror.

In certain exemplary embodiments, the image offsetting apparatus is positioned between the optical targeting device and the target.

In certain exemplary embodiments, the offset image pathway is offset from longitudinal axis of the optical targeting device and offset from a vertical plane formed between a longitudinal axis of the optical targeting device and a longitudinal axis of a barrel of a firearm to which the optical targeting device and the image offsetting apparatus are attached or coupled.

In various exemplary, nonlimiting embodiments, the present disclosure provides an image offsetting apparatus for producing an offset image pathway for a target image of a target and providing the offset target image to an optical targeting device, including at least some of a housing having an optical cavity formed therein, wherein the optical cavity extends from an incoming image aperture formed through a first portion of the housing to an outgoing image aperture formed through a second portion of the housing, wherein the housing is positionable between the optical targeting device and a target; and a mirror assembly positioned within at least a portion of the optical cavity, wherein the mirror assembly receives the target image through the incoming image aperture and reflects the target image through the outgoing image aperture, such that the target image entering the incoming image aperture exits the outgoing image aperture at a determined offset that is offset from and at least substantially parallel to a direct image pathway from the target to the optical targeting device, and wherein the offset image pathway is offset from longitudinal axis of the optical targeting device and offset from a vertical plane formed between a longitudinal axis of the optical targeting device and a longitudinal axis of a barrel of a firearm to which the optical targeting device and the image offsetting apparatus are attached or coupled.

In certain exemplary embodiments, the mirror assembly comprises at least one first rotatably adjustable component mirror and at least one second rotationally adjustable component mirror.

In various exemplary, nonlimiting embodiments, the offset image pathway is provided within a plane that is substantially horizontally offset from the direct image pathway.

In various exemplary, nonlimiting embodiments, a barrel does not intercept the offset image pathway between the target object and the optic.

In various exemplary, nonlimiting embodiments, heat radiating from a barrel does not intercept the offset image pathway between the target object and the optic.

In various exemplary, nonlimiting embodiments, the image offsetting apparatus further comprises one or more lenses aligned with the first component mirror and/or the second component mirror.

Accordingly, the presently disclosed systems, methods, and/or apparatuses separately and optionally provide an alternate or offset image pathway from the target object to an optic.

The presently disclosed systems, methods, and/or apparatuses separately and optionally provide an image offsetting apparatus that produces an offset image pathway such that a barrel or any forward mounted accessory does not intercept the offset image pathway between a target object and an optic.

The presently disclosed systems, methods, and/or apparatuses separately and optionally provide an image offsetting apparatus that produces an offset image pathway such that heat radiating from a barrel or any forward mounted accessory does not intercept the offset image pathway between a target object and an optic.

These and other aspects, features, and advantages of the presently disclosed systems, methods, and/or apparatuses are described in or are apparent from the following detailed description of the exemplary, non-limiting embodiments of the presently disclosed systems, methods, and/or apparatuses and the accompanying figures. Other aspects and features of embodiments of the presently disclosed systems, methods, and/or apparatuses will become apparent to those of ordinary skill in the art upon reviewing the following description of specific, exemplary embodiments of the presently disclosed systems, methods, and/or apparatuses in concert with the figures. While features of the presently disclosed systems, methods, and/or apparatuses may optionally be discussed relative to certain embodiments and figures, all embodiments of the presently disclosed systems, methods, and/or apparatuses can include one or more of the features discussed herein.

Further, while one or more embodiments may optionally be discussed as having certain advantageous features, one or more of such features may optionally also be used with the various embodiments of the systems, methods, and/or apparatuses discussed herein. In similar fashion, while exemplary embodiments may optionally be discussed below as device, system, or method embodiments, it is to be understood that such exemplary embodiments can be implemented in various devices, systems, and methods of the presently disclosed systems, methods, and/or apparatuses.

Any benefits, advantages, or solutions to problems that are described herein with regard to specific embodiments are not intended to be construed as a critical, required, or essential feature(s) or element(s) of the presently disclosed systems, methods, and/or apparatuses or the claims.

BRIEF DESCRIPTION OF THE SEVERAL VIEWS OF THE DRAWINGS

As required, detailed exemplary embodiments of the presently disclosed systems, methods, and/or apparatuses are disclosed herein; however, it is to be understood that the disclosed embodiments are merely exemplary of the presently disclosed systems, methods, and/or apparatuses that may optionally be embodied in various and alternative forms, within the scope of the presently disclosed systems, methods, and/or apparatuses. The figures are not necessarily to scale; some features may optionally be exaggerated or minimized to illustrate details of particular components. Therefore, specific structural and functional details disclosed herein are not to be interpreted as limiting, but merely as a basis for the claims and as a representative basis for teaching one skilled in the art to employ the presently disclosed systems, methods, and/or apparatuses.

The exemplary embodiments of the presently disclosed systems, methods, and/or apparatuses will be described in detail, with reference to the following figures, wherein like reference numerals refer to like parts throughout the several views, and wherein.

DETAILED DESCRIPTION OF EXEMPLARY EMBODIMENTS OF THE DISCLOSURE

Figure 1:
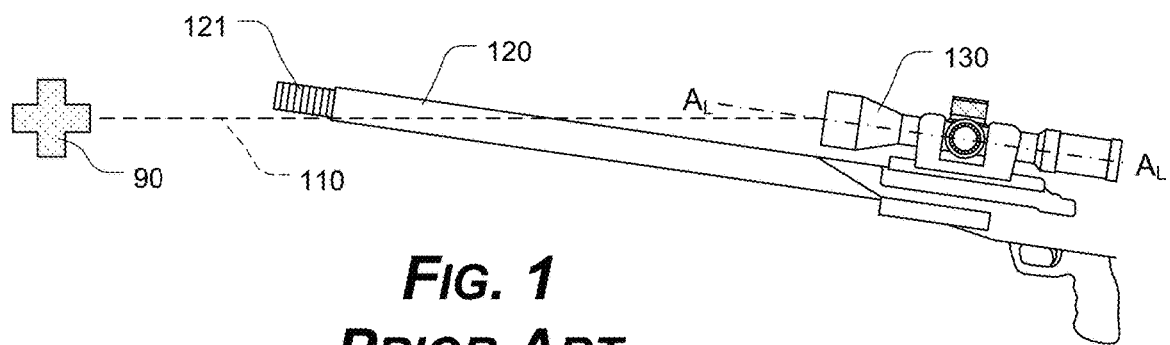
FIG. 1 illustrates a side view of an exemplary direct image pathway in its standard position before entering an existing optics device, wherein the direct image pathway is intercepted by the barrel and muzzle obstructing line of sight to the optic.

For simplicity and clarification, the design factors and operating principles for the image offsetting apparatuses, systems, and methods according to the present disclosure are explained with reference to various exemplary embodiments of the image offsetting systems, methods, and apparatuses according to the presently disclosed systems, methods, and/or apparatuses. The basic explanation of the design factors and operating principles of the image offsetting systems, methods, and apparatuses is applicable for the understanding, design, and operation of the image offsetting systems, methods, and apparatuses of the presently disclosed systems, methods, and/or apparatuses. It should be appreciated that the image offsetting systems, methods, and apparatuses can be adapted to many applications where image offsetting systems, methods, and apparatuses can be used.

As used herein, the word "may" is meant to convey a permissive sense (i.e., meaning "having the potential to"), rather than a mandatory sense (i.e., meaning "must"). Unless stated otherwise, terms such as "first" and "second" are used to arbitrarily distinguish between the exemplary embodiments and/or elements such terms describe. Thus, these terms are not necessarily intended to indicate temporal or other prioritization of such exemplary embodiments and/or elements.

The term "coupled", as used herein, is defined as connected, although not necessarily directly, and not necessarily mechanically. The terms "a" and "an" are defined as one or more unless stated otherwise.

The term "exemplary" is used herein to mean "serving as an example, instance, or illustration". Any embodiment described herein as "exemplary" is not necessarily to be construed as preferred or advantageous over other embodiments. Likewise, the term "embodiment" does not require that all embodiments of the invention include the discussed feature, advantage, or mode of operation.

Throughout this application, the terms "comprise" (and any form of comprise, such as "comprises" and "comprising"), "have" (and any form of have, such as "has" and "having"), "include", (and any form of include, such as "includes" and "including") and "contain" (and any form of contain, such as "contains" and will "containing") are used as open-ended linking verbs. It will be understood that these terms are meant to imply the inclusion of a stated element, integer, step, or group of elements, integers, or steps, but not the exclusion of any other element, integer, step, or group of elements, integers, or steps. As a result, a system, method, or apparatus that "comprises", "has", "includes", or "contains" one or more elements possesses those one or more elements but is not limited to possessing only those one or more elements. Similarly, a method or process that "comprises", "has", "includes" or "contains" one or more operations possesses those one or more operations but is not limited to possessing only those one or more operations.

Aspects of the invention are disclosed in the following description and related drawings directed to exemplary embodiments of the invention. Alternate embodiments may optionally be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

It should also be appreciated that the terms "firearm", "rifle", "optic", and "image offsetting apparatus" are used for basic explanation and understanding of the operation of the systems, methods, and apparatuses of the presently disclosed systems, methods, and/or apparatuses. Therefore, the terms "firearm", "rifle", "optic", and "image offsetting apparatus" are not to be construed as limiting the systems, methods, and apparatuses of the presently disclosed systems, methods, and/or apparatuses. For example, it should be appreciated that the term "optic" may include scopes, sights, holographic sights, red dot sights, reflex sights, and the like.

Figure 2:
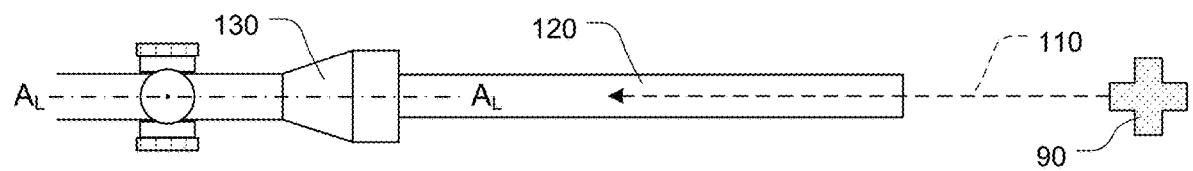
FIG. 2 illustrates a top view of an exemplary direct image pathway in its standard position before entering an existing optics device, wherein the direct image pathway is intercepted by the barrel and muzzle obstructing line of sight to the optic.
Figure 3:
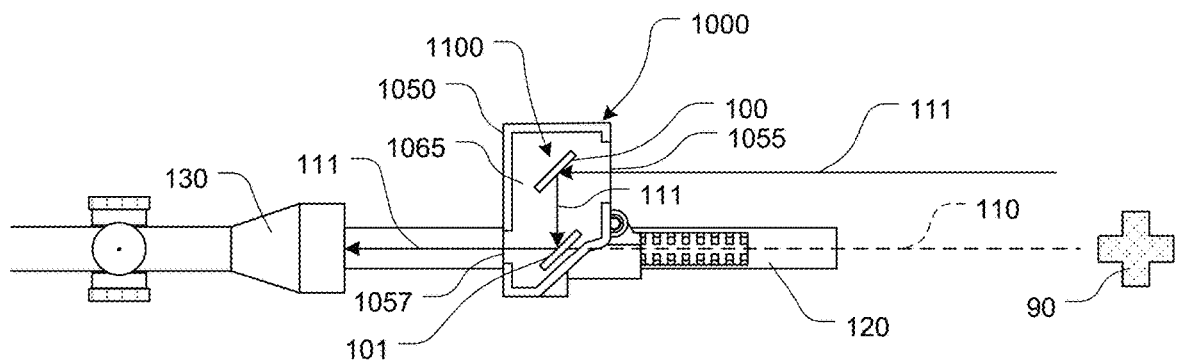
FIG. 3 illustrates a top view of an exemplary diagram of an image offsetting device and system, according to the present disclosure.
Figure 4:
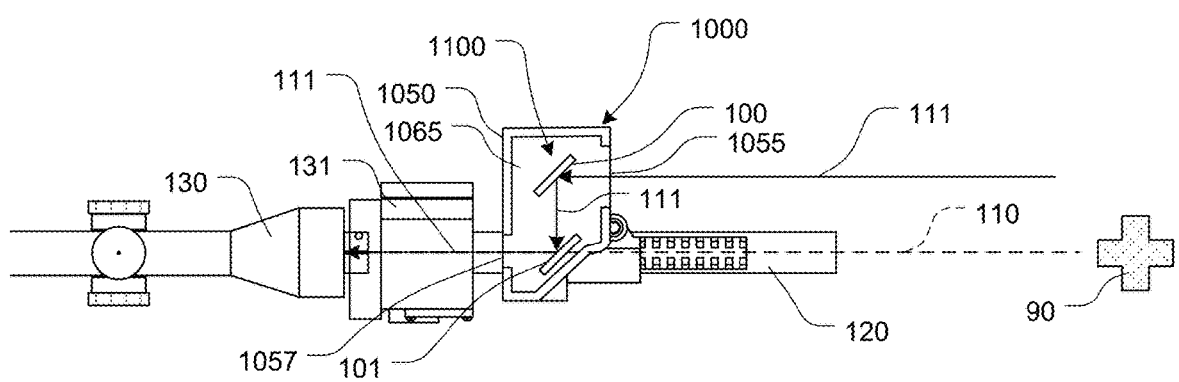
FIG. 4 illustrates a top view of an exemplary diagram of an image offsetting device and system, according to the present disclosure.
Figure 5:
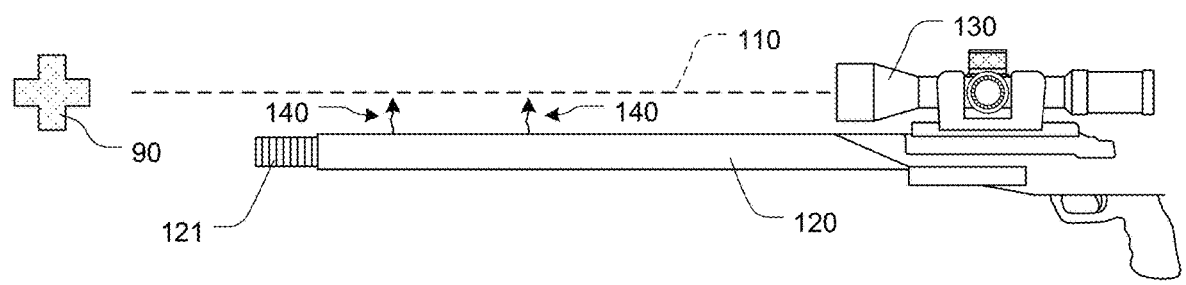
FIG. 5 illustrates a side view of a direct image pathway in its standard position before entering an existing optics device, wherein the direct image pathway is distorted by heat from the barrel or other forward mount accessory before reaching the optic.
Figure 6:
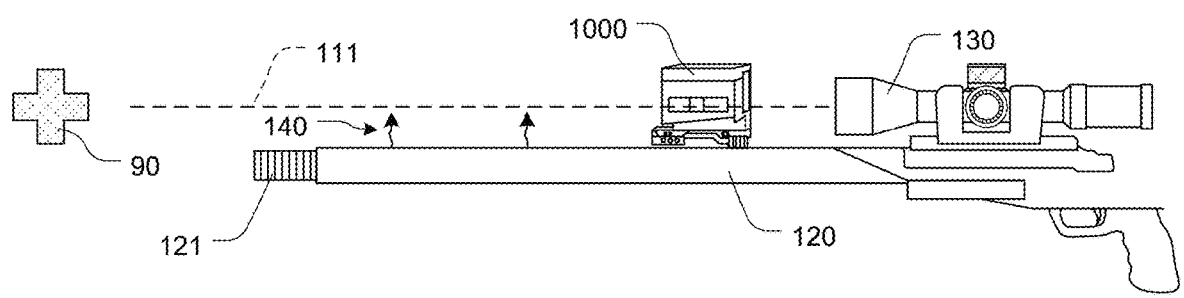
FIG. 6 illustrates an exemplary diagram of an image offsetting device and system, according to the present disclosure.

Turning now to the appended drawing figures, FIGS. 1, 2, and 5 illustrate certain elements associated with a known firearm, including a barrel 120, a muzzle 121, and an optical targeting device 130, while FIGS. 3-4 and 6-9 illustrate certain features and/or elements of an exemplary embodiment of an image offsetting apparatus 1000 attached or coupled to the exemplary firearm, according to the present disclosure.

As illustrated in FIGS. 1 and 2, the optical line of sight, or direct image pathway 110, from the optical targeting device 130 to the object 90 may be blocked by one or more of the barrel 120 and the muzzle 121. As illustrated, a direct image pathway 110 is shown in a standard position before entering an existing optical targeting device 130, such as a scope, reticle, or the like, or any other aiming device. As further illustrated, the direct image pathway 110 may be intercepted by the barrel 120 and muzzle 121 obstructing line of sight of the direct image pathway 110 to the optical targeting device 130.

As illustrated in FIG. 5, an incoming, direct image pathway 110 is illustrated in a position before entering the optical targeting device 130. Here, the direct image pathway 110 is not blocked by the barrel 120 or the muzzle 121, but the image of the object 90, along the direct image pathway 110, is distorted by radiated heat 140 from the barrel 120 or from other forward mount accessories (not shown) before entering the optical targeting device 130. In either case, the optical line of sight, or direct image pathway 110, from the firearm optical targeting device 130 to the target object 90 is obstructed or distorted, before entering the optical targeting device 130, hampering or negating the capability to make an accurate shot with the firearm.

FIGS. 3-4 and 6-9 illustrate certain features and/or elements of an exemplary embodiment of the image offsetting apparatus 1000 attached or coupled to the exemplary firearm. In various exemplary, nonlimiting embodiments, the image offsetting apparatus 1000 comprise a scope or other device that is attached, coupled, or mounted to the firearm, such as a rifle, that can allow a user to more accurately acquire, view, range, and shoot targets at extended ranges or through rapid deployment of the system.

In these exemplary embodiments, a direct image pathway 110 is illustrated, as well as an offset image pathway 111. The offset image pathway 111 is typically provided to one side or the other of the barrel 120. For example, if the direct image pathway 110 is provided at a 12 o'clock position relative to the barrel 120, as illustrated most clearly in FIG. 8, the offset image pathway 111 may be provided at a position between a 1 o'clock position in a 5 o'clock position or an 11 o'clock position and a 7 o'clock position relative to the barrel 120. In certain exemplary embodiments, the offset image pathway 111 may be provided at a position of either 9 o'clock or 3 o'clock, relative to the barrel 120, as illustrated most clearly in FIG. 9.

The reference to clock positions refers to a relative direction using the analogy of a 12-hour clock to describe angles and/or directions. As utilized herein, the clock face is provided in an upright or vertical orientation, such that a 12 o'clock position is (90°) upward from the barrel 120, the 6 o'clock position is (−90°) downward from the barrel 120, the 3 o'clock position is (0°) to the right of the barrel 120, and the 9 o'clock position is (180°) to the left of the barrel 120, when viewed from the rear.

In certain exemplary embodiments, as illustrated, the image offsetting apparatus 1000 comprises a mirror assembly 1100. In these exemplary embodiments, the mirror assembly 1100 comprises one or more first component mirror 100 and second component mirror 101. The first component mirror 100 and second component mirror 101 may be coupled with existing optical targeting device 130. Thus, when the direct image pathway 111 from target object 90 passes through the mirror assembly 1100, and the internal first component mirror 100 and second component mirror 101, and is presented to the optical targeting device 130, the barrel 120 does not intercept the offset image pathway 111 of target object 90 to optical targeting device 130.

In certain exemplary embodiments, as illustrated in FIG. 4, the image offsetting apparatus 1000 provides an offset image pathway 111 that is substantially parallel but offset from the direct image pathway 110. The mirror assembly 1100 may optionally be comprised of first component mirror 100 and second component mirror 101 and may be coupled with existing optical targeting devices 130 and other optical components 131. Thus, when the original image of the target object 90 passes through the mirror assembly 1100 and the internal first component mirror 100 and second component mirror 101, and optical accessory 131 to optical targeting device 130, the barrel 120 does not intercept the offset image pathway 111 of target object 90 to optical targeting device 130.

As illustrated, the image offsetting apparatus 1000 is utilized to produce an offset image pathway 111 and present the offset image pathway 111 to the optical targeting device 130. The mirror assembly 1100, comprising the first component mirror 100 and second component mirror 101 may be coupled with existing optical targeting devices 130. Thus, when the original image of the target object 90 passes through the mirror assembly 1100 and the internal first component mirror 100 and second component mirror 101, to optical targeting device 130, the radiated heat 140 from barrel 120 does not intercept the offset image pathway 111 from target object 90.

The direct image pathway 110 generally extends along the longitudinal axis, $A_L$, of the optical targeting device 130 and along the longitudinal axis, $A_L$, of the barrel 140. The longitudinal axis, $A_L$, of the optical targeting device 130 and the longitudinal axis, $A_L$, of the barrel 140 typically form a vertical plane, $P_V$.

The incoming image aperture 1055 is formed offset from the longitudinal axis, $A_L$, of the optical targeting device 130 and along the longitudinal axis, $A_L$, of the barrel 140. Thus, the offset image pathway 111 is at least partially offset from the longitudinal axis, $A_L$, of the optical targeting device 130, offset from the longitudinal axis, $A_L$, of the barrel 140, and offset from the vertical plane, $P_V$.

In certain exemplary embodiments, as illustrated, the offset image pathway 111 is substantially parallel to the direct image pathway 110. Alternatively, the offset image pathway 111 may intersect the direct image pathway 110.

Figure 7:
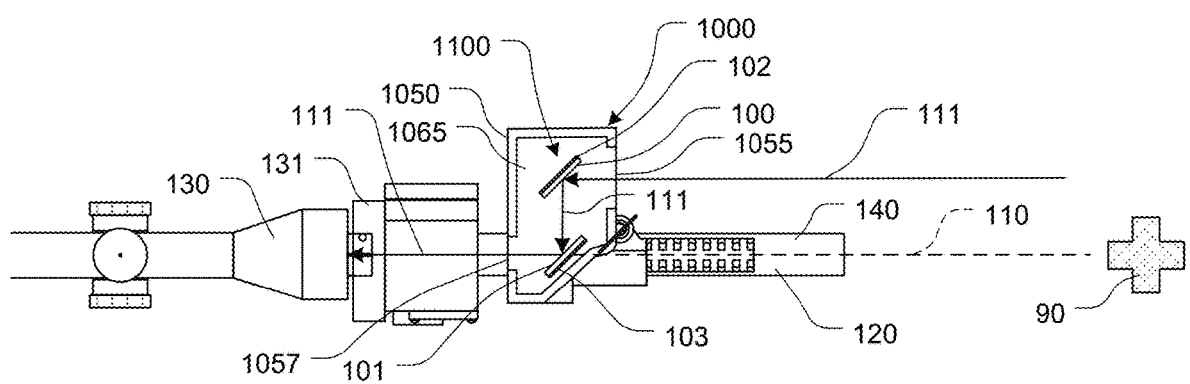
FIG. 7 illustrates a top view of an exemplary diagram of an image offsetting device and system, according to the present disclosure.
Figure 8:
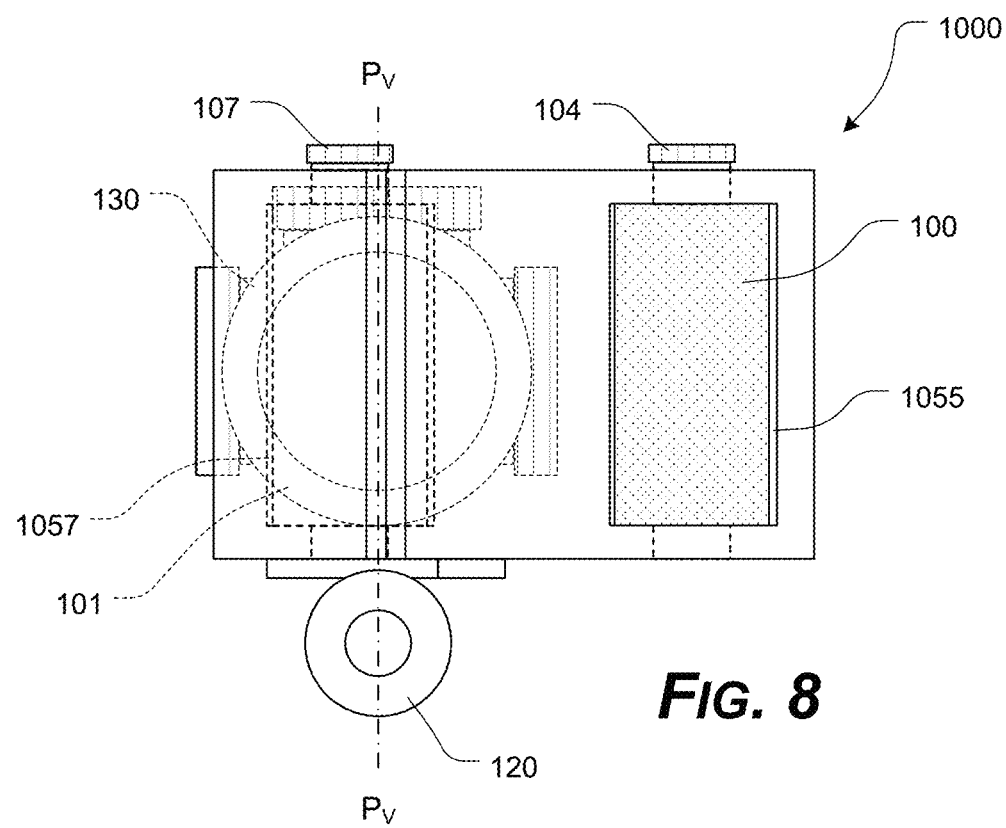
FIG. 8 illustrates a front view of an exemplary diagram of an image offsetting device and system, according to the present disclosure.
Figure 9:
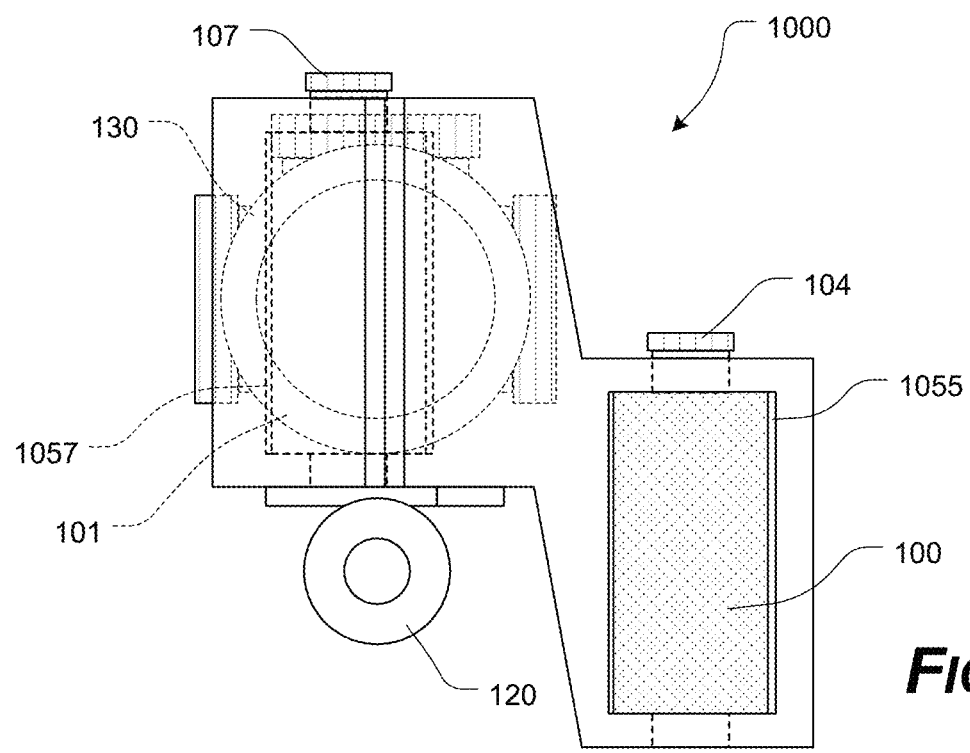
FIG. 9 illustrates a front view of an exemplary diagram of an image offsetting device and system, according to the present disclosure.

As illustrated, for example, in FIG. 7, the image offsetting apparatus 1000 provides an offset image pathway 111. The mirror assembly 1100 may be coupled with existing optical targeting device 130 and other optical components 131. Thus, when the original image of the target object 90 passes through the mirror assembly 1100, and optical accessory 131 to optical targeting device 130, the radiated heat 140 from barrel 120 does not intercept the offset image pathway 111 from target object 90.

The image offsetting apparatus 1000 may be such that, by implementing the image offsetting apparatus 1000, the effective range of the firearm, utilizing the image offsetting apparatus 1000 and the optical targeting device 130, may be substantially increased, for example about 200% or more.

The image offsetting apparatus 1000 described in exemplary embodiments herein may be such that the image offsetting apparatus 1000 presents an image of the target object 90 from an offset image pathway 111 to the optical targeting device 130. Thus, the image of the target object 90, as presented to the optical targeting device 130 is shifted from the direct image pathway 110, around the barrel 120 and the muzzle 121, such that the barrel 120 and the muzzle 121 and any thermal rise or radiated heat 140 do not block or distort the image presented to the optical targeting device 130.

The image offsetting apparatus 1000 is positioned so as to retain a parallel axis to the bore of the barrel 120 and may be used or applied on or with respect to any shooting platform, or with respect to any rail or mounts. Furthermore, the image offsetting apparatus 1000 may be utilized without additional tools or without negatively impacting or adjusting the optical targeting device 130.

The image offsetting apparatus 1000 shifts the optical path presented to the optical targeting device 130 from the axis that can be intercepted by the barrel 120 or any forward mount accessory 121 and/or the radiated heat 140 from the barrel 120 or other forward mount accessory 121 to an axis parallel to the bore of the barrel 120 where the barrel 120 cannot obstruct the pathway from the target object 90 to the optical targeting device 130.

The image offsetting apparatus 1000 may be used to shift the incoming image's optical path around the barrel 120 before reaching the optical targeting device 130. This optical shift around the barrel 120 may take place on any plane around the barrel 120 in either, or both of, x and y axes.

It should be appreciated that, in various exemplary embodiments, the image offsetting apparatus 1000 may optionally be an independent or standalone device. Alternatively, the image offsetting apparatus 1000 may optionally be integrated into other optical components and attached or coupled to any rail or mount or to any existing image offsetting apparatus or optic, such as a scope or other such device.

In one exemplary embodiment, the image offsetting apparatus 1000 may be utilized with a 7-35×56 mm optical targeting device 130. It should be appreciated, however, that other variations may be utilized or implemented. In this example, the optical targeting device 130 may have an adjustment capability of about 30 MIL of angle. It may further be appreciated that although MIL may be used in exemplary embodiments herein, the same principals, devices, methods and techniques may be used with respect to minutes of angle (MOA) and they may be adjusted in any desired increments, for example 20 MOA, 25 MOA, 150 MOA, and so forth. In the example, different sight-in techniques may be utilized. For example, a 100 meter zero may be obtained and the elevation turrets of the optical targeting device 130 may be utilized to their standard limits example 30 MIL. In this example the 30 MIL could allow a 2200 m shot with a typical high performance round. Utilizing specialized optics, bases, rings, rails, or the like, to add an additional 100 MIL, accurate sighting could be made for up +3000 yds using a desired ammunition, such as .375CheyTac. In this example, the image offsetting apparatus 1000 may be utilized on a rifle with a barrel 120 and muzzle measuring 36 inches and 4 inches, respectively. In this example, the barrel 120 and muzzle obstruct the direct image pathway 110 between a target object 90 and the optical targeting device 130, negating the capability to make a long range shot. In still another exemplary embodiment, the image offsetting apparatus 1000 shifts the optical pathway between the target object 90 and the optical targeting device 130 from the direct image pathway 110 to the offset image pathway 111, which is taken along the side of the barrel 120.

In another exemplary embodiment, a tactical rifle such as an AR-10/15 rifle with a holographic sight, or the like, and a suppressor may be utilized. In this exemplary embodiment, the image offsetting apparatus 1000 shifts the optical pathway between the target object 90 and the optical targeting device 130 from the direct image pathway 110 to the offset image pathway 111, which is taken along the side of the barrel 120, away from the direct path of the radiated heat 140 of the hot barrel and suppressor emitting a thermal mirage, from the radiated heat 140, allowing for accurate sighting and targeting up to 600 yds, significantly improving the capability to sight on the target object 90. Still other scopes and weapons could have a range far greater than the example provided.

In certain exemplary, nonlimiting embodiments, systems, methods, and apparatuses for horizontally offsetting an image pathway from the direct image pathway 110 for an optical targeting device 130 are provided. The methods may include providing an image offsetting apparatus 1000 comprising a mirror assembly 1100 having two or more first component mirror 100 and second component mirror 101 and/or lenses offset between a target object 90 and an optical targeting device 130. The mirrored image offsetting apparatus 1000 may be utilized to relay a horizontally offset target image, which is then viewed through the optical targeting device 130.

In certain exemplary, nonlimiting embodiments, an image offsetting apparatus 1000 for producing an offset image is provided. The mirrored optical offsetting image apparatus, or image offsetting apparatus 1000, may include an optic having a zero and set magnification range. The image offsetting apparatus 1000 may further include an optical adjustment mirror/lens assembly that is removably disposed in a line of sight between a target object 90 and the optical targeting device 130 and/or its reticle/aim point. The image offsetting apparatus 1000 may relay a horizontally offset target image before the target image reaches the optical targeting device 130 and/or the aim point of the optical targeting device 130.

In various exemplary, nonlimiting embodiments, the image offsetting apparatus 1000 comprises at least some of a housing 1050 having an optical cavity 1065 defined at least partially within the housing 1050. The optical cavity 1065 extends from an incoming image aperture 1055 to an outgoing image aperture 1057. Two or more adjustable mirror holders, each having an attached or coupled component mirror, each component mirror having a reflective surface, are positioned parallel to each other within the optical cavity 1065.

The adjustable mirror holders 102 and 103, respectively, secure and adjust the reflective surfaces of the first component mirror 100 and second component mirror 101, such that an image entering the incoming image aperture 1055 can be reflected off the reflective surfaces of the component mirrors, so as to exit the outgoing image aperture 1057 at a determined offset that is horizontally offset and parallel or near parallel to the direct image pathway 110.

In various exemplary embodiments, an adjustment knob 104 is attached or coupled to the adjustable mirror holder 102 and an adjustment knob 107 is attached or coupled to the adjustable mirror holder 103. Rotational movement of the adjustment knob 104 and/or 107 results in rotational movement of the first component mirror 100 and second component mirror 101, respectively.

In various exemplary, nonlimiting embodiments, the image offsetting apparatus 1000 includes a housing 1050 having an optical cavity 1065 defined at least partially within the housing 1050, wherein the optical cavity 1065 extends from an incoming image aperture 1055 to an outgoing image aperture 1057 and at least one adjustable mirror holder 102 or 103 positioned within at least a portion of the optical cavity 1065, wherein at least a portion of the at least one adjustable mirror holder 102 or 103 includes a component mirror having a reflective surface attached or coupled thereto, and wherein adjustment of the adjustable mirror holder 102 or 103 through axial rotation, set screws, or, without limitation or restriction, other means, adjusts the reflective surface of the component mirror such that an image entering the incoming image aperture 1055 can be reflected off of the reflective surface, so as to exit the outgoing image aperture 1057 at a determined offset that is horizontally offset and parallel or near parallel to the direct image pathway 110.

In various exemplary embodiments, the at least one adjustable mirror holder 102 or 103 is adjustable in an x or y axis.

In certain exemplary, nonlimiting embodiments, the image offsetting apparatus 1000 includes a housing 1050 having an optical cavity 1065 defined at least partially within the housing 1050, wherein the optical cavity 1065 extends from an incoming image aperture 1055 to an outgoing image aperture 1057 and two or more adjustable mirror holders positioned within at least a portion of the optical cavity 1065, wherein at least a portion of each of the adjustable mirror holders includes a component mirror having a reflective surface attached or coupled thereto, and wherein adjustment of the adjustable mirror holders through axial rotation, set screws, or, without limitation or restriction, other means, independently adjusts the reflective surface of each component mirror such that an image entering the incoming image aperture 1055 can be reflected off of the reflective surfaces of the component mirrors, so as to exit the outgoing image aperture 1057 at a determined offset that is horizontally offset and parallel or near parallel the direct image pathway 110.

In various exemplary embodiments, the at least one adjustable mirror holder 102 or 103 is adjustable in an x or y axis.

In certain exemplary embodiments, the reflective surface or surfaces is/are a reflective surface element attached or coupled to the at least one adjustable mirror holder 102 or 103.

In certain exemplary embodiments, two or more adjustable mirror holders are included, each having an associated reflective surface or reflective surface element.

In various exemplary, nonlimiting embodiments, the image offsetting apparatus 1000 of the present disclosure comprises at least some of a housing 1050 having an optical cavity 1065 defined at least partially within the housing 1050, wherein the optical cavity 1065 extends from an incoming image aperture 1055 to an outgoing image aperture 1057; at least one first component mirror positioned within at least a portion of the optical cavity 1065, wherein at least a portion of the at least one first mirror holder includes a component mirror having a reflective surface attached or coupled thereto, wherein the at least one first mirror holder can be at least partially rotated through axial rotation, set screws, or, without limitation or restriction, other means; and at least one second component mirror positioned within at least a portion of the optical cavity 1065, wherein at least a portion of the at least one second component mirror includes a component mirror having a reflective surface attached or coupled thereto, wherein the at least one second mirror holder can be at least partially rotated through axial rotation, set screws, or, without limitation or restriction, other means; wherein the reflective surface of the at least one first component mirror is positioned so as to receive an target image through the incoming image aperture 1055 and reflect the target image to the reflective surface of the at least one second component mirror, and wherein the reflective surface of the at least one second component mirror is positioned so as to receive the target image from the reflective surface of the at least one first component mirror and reflect the target image through the outgoing image aperture 1057; and wherein adjustment of the at least one first component mirror and/or the at least one second component mirror adjusts an angle at which the target image is reflected through the outgoing image aperture 1057 to make the alternate image pathway horizontally offset and parallel or near parallel to the direct image pathway 110.

In various exemplary embodiments, the at least one adjustable mirror holder 102 or 103 is adjustable in an x or y axis.

In various exemplary, nonlimiting embodiments, the reflective surface of the at least one first component mirror and/or the reflective surface of the at least one second component mirror is a polished or coated portion, a concave surface, or a convex surface of the at least one first component mirror and/or the reflective surface of the at least one second component mirror.

In various exemplary, nonlimiting embodiments, the reflective surface of the at least one first component mirror and/or the reflective surface of the at least one second component mirror is a plane mirror or a magnifying mirror attached or coupled to the at least one adjustable mirror holder 102 or 103.

In various exemplary, nonlimiting embodiments, a determined adjustment of the at least one first component mirror and/or a determined adjustment of the at least one second component mirror adjusts an angle at which the target image is reflected through the outgoing image aperture 1057 at a determined offset that is parallel or near parallel and horizontally offset to the direct image pathway 110.

In various exemplary, nonlimiting embodiments, the image offsetting systems, methods, and apparatuses of the present disclosure comprises at least some of a housing 1050 having an optical cavity 1065 defined at least partially within the housing 1050, wherein the optical cavity 1065 extends from an incoming image aperture 1055 to an outgoing image aperture 1057; and one or more adjustable mirror holders 102 and/or 103, wherein each adjustable mirror holder 102 or 103 is positioned within at least a portion of the optical cavity 1065, wherein at least a portion of each of the adjustable mirror holders 102 and/or 103 includes a component mirror having a reflective surface attached or coupled thereto, and wherein adjustment of at least one of the adjustable mirror holders 102 and/or 103 adjusts the reflective surfaces such that a target image entering the incoming image aperture 1055 is reflected by the reflective surfaces, so as to exit the outgoing image aperture 1057 at a determined offset that is parallel or near parallel and horizontally offset to the direct image pathway 110.

In certain exemplary, nonlimiting embodiments, certain of the elements of the image offsetting apparatus 1000, such as, for example, the mirror assembly 1100, the component mirrors 100 and/or 101, and/or the adjustable mirror holders 102 and/or 103 are adjustable for calibration of the image offsetting apparatus 1000. Once adjusted, certain or each of these elements may be fixed for an exact pre-prescribed horizontal shift of the offset image pathway 111. These elements may be fixed by a mechanical element, various glues, adhesives, or the like, to prevent or discourage movement of the elements from their fixed or desired position.

In various exemplary, nonlimiting embodiments of the method, the reflective surface of the at least one first component mirror and/or the reflective surface of the at least one second component mirror is a plane mirror attached or coupled to the at least one adjustable mirror holder 102 or 103.

The presently disclosed systems, methods, and/or apparatuses separately and optionally provide image offsetting systems, methods, and/or apparatuses that allow a user to swap or replace devices with different mirrors/lenses and/or capabilities.

It should also be appreciated that the terms "image offsetting", "adjustable mirror holder", "mirror", and "firearm" are used for basic explanation and understanding of the operation of the systems, methods, and/or apparatuses of the presently disclosed systems, methods, and/or apparatuses. Therefore, the terms "image offsetting", "adjustable mirror holder", "mirror", and "firearm" are not to be construed as limiting the systems, methods, and/or apparatuses of the presently disclosed systems, methods, and/or apparatuses.

For simplicity and clarification, the visual image offsetting systems, methods, and/or apparatuses of the presently disclosed systems, methods, and/or apparatuses will be described as being used in conjunction with a firearm, such as a rifle or carbine. However, it should be appreciated that these are merely exemplary embodiments of the image offsetting systems, methods, and/or apparatuses and are not to be construed as limiting the presently disclosed systems, methods, and/or apparatuses. Thus, the image offsetting systems, methods, and/or apparatuses of the presently disclosed systems, methods, and/or apparatuses may be utilized in conjunction with any object or device.

In various exemplary embodiments, various components of the image offsetting apparatus 1000 are substantially rigid and are formed of steel. Alternate materials of construction of the various components of the image offsetting apparatus 1000 may include one or more of the following: stainless steel, aluminum, titanium, polytetrafluoroethylene, and/or other metals, as well as various alloys and composites thereof, glass-hardened polymers, polymeric composites, polymer or fiber reinforced metals, carbon fiber or glass fiber composites, continuous fibers in combination with thermoset and thermoplastic resins, chopped glass or carbon fibers used for injection molding compounds, laminate glass or carbon fiber, epoxy laminates, woven glass fiber laminates, impregnate fibers, polyester resins, epoxy resins, phenolic resins, polyimide resins, cyanate resins, high-strength plastics, nylon, glass, or polymer fiber reinforced plastics, thermoform and/or thermoset materials, and/or various combinations of the foregoing. Thus, it should be understood that the material or materials used to form the various components of the image offsetting apparatus 1000 is a design choice based on the desired appearance and functionality of the image offsetting apparatus 1000.

It should be appreciated that certain elements of the image offsetting apparatus 1000 may be formed as an integral unit. Alternatively, suitable materials can be used and sections or elements made independently and attached or coupled together, such as by adhesives, welding, screws, rivets, pins, or other fasteners, to form the various elements of the image offsetting apparatus 1000.

It should also be understood that the overall size and shape of the image offsetting apparatus 1000, and the various portions thereof, is a design choice based upon the desired functionality and/or appearance of the image offsetting apparatus 1000.

The above weapons, scopes, magnifications, ranges, and adjustments by the optical magnification device in the above applications are for exemplary purposes and it may be understood by a person having ordinary skill in the art that a variety of weapons, scopes, magnifications, ranges, and adjustments may be utilized and achieved.

It should be appreciated that the component mirrors and lens may be any type of mirror and lens, for example glass, plastic, crystal, fused silica, sapphire, reflective or polished metals, silicon or any other material hard durable surface.

In various exemplary, nonlimiting embodiments, an optical lens or other device may optionally be used at either or both of the incoming aperture 1055 and/or the outgoing aperture 1057 to increase or decrease the apparent offset in x and/or y axis to purposely further offset or correct the offset image pathway 111 so that the offset image pathway 111 is more parallel to the direct image pathway 110. Thus, for example, if an image, after offset, is 2 MOA high and 3 MOA to the right, a lens could be positioned to negate the extra (perhaps unwanted) offset for ballistic compensation. The optical lens or other device could optionally be utilized to correct internal error within the offsetting apparatus 1000 or induce an "error" for a determined, set value.

The image offsetting apparatus 1000 may be employed in visible spectrum optics, low light level devices (night optics), filtration, and other enhanced image devices.

Using the image offsetting apparatus 1000 may create a greater and/or more precise operating range that could be applied to a larger variety of optical targeting devices 130. Such optical targeting device 130 can include, but are not limited to, scopes, night vision optics, ACOGs, holographic devices, red dots, lasers, targeting devices, iron sights, mechanical devices, and the like. The image offsetting apparatus 1000 can further be applied in layers and/or steps that can allow for stepped optical shift changes (i.e. vertically and/or horizontally). For example, the image offsetting apparatus 1000 may be adjusted to provide small variations, as desired by a user, to improve sighting or targeting. Such adjustments may allow for the adjusting of the zero of a rifle or reticle in any horizontal (x) or vertical (y) direction, or any combination thereof. It may further be appreciated that the zero of a rifle or optical system can be adjusted in any desired various increments by changing the tilt/slant/angle or elevation of the mirrors and lenses and in turn the horizontally offset image in the exemplary embodiments described herein. Such additions or subtractions may be made manually or automatically. For example, some exemplary embodiments may allow a person to use the image offsetting apparatus 1000 as purchased, or use a machined key, turret, or fully electronic and ballistically driven assembly to create adjustable secondary zeroes.

It can be further appreciated that typical lenses transmit object/target image errors at a value that coincides with the glass optical index. In a typical case a typical lens will only transmit 50% of an error introduced by the lens. Mirrors 100, 101 as used in our device transmit an error at a factor of 2×. It may be appreciated that the image offsetting apparatus 1000, in total, could contain 2 or more mirrors/reflective bodies 100, 101, thereby introducing errors of 4× or more from the original introduced error. It may be further appreciated that the image offsetting apparatus 1000 must be capable of working within image errors of a total of less than single digit arc seconds though this is not to limit the design, functionality, and performance of image offsetting apparatus 1000.

The foregoing description and accompanying drawings illustrate the principles, preferred embodiments, and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

It should also be appreciated that a more detailed explanation of the instructions regarding how to attach or couple the image offsetting apparatus 1000 to a rifle or other device, and certain other items and/or techniques necessary for the implementation and/or operation of the various exemplary embodiments of the presently disclosed systems, methods, and/or apparatuses are not provided herein because such elements are commercially available and/or such background information will be known to one of ordinary skill in the art. Therefore, it is believed that the level of description provided herein is sufficient to enable one of ordinary skill in the art to understand and practice the presently disclosed systems, methods, and/or apparatuses, as described.

While the presently disclosed systems, methods, and/or apparatuses has been described in conjunction with the exemplary embodiments outlined above, the foregoing description of exemplary embodiments of the presently disclosed systems, methods, and/or apparatuses, as set forth above, are intended to be illustrative, not limiting and the fundamental disclosed systems, methods, and/or apparatuses should not be considered to be necessarily so constrained. It is evident that the presently disclosed systems, methods, and/or apparatuses is not limited to the particular variation set forth and many alternatives, adaptations modifications, and/or variations will be apparent to those skilled in the art.

Furthermore, where a range of values is provided, it is understood that every intervening value, between the upper and lower limit of that range and any other stated or intervening value in that stated range is encompassed within the presently disclosed systems, methods, and/or apparatuses. The upper and lower limits of these smaller ranges may independently be included in the smaller ranges and is also encompassed within the presently disclosed systems, methods, and/or apparatuses, subject to any specifically excluded limit in the stated range. Where the stated range includes one or both of the limits, ranges excluding either or both of those included limits are also included in the presently disclosed systems, methods, and/or apparatuses.

It is to be understood that the phraseology of terminology employed herein is for the purpose of description and not of limitation. Unless defined otherwise, all technical and scientific terms used herein have the same meaning as commonly understood by one of ordinary skill in the art to which the presently disclosed systems, methods, and/or apparatuses belongs.

In addition, it is contemplated that any optional feature of the inventive variations described herein may be set forth and claimed independently, or in combination with any one or more of the features described herein.

Accordingly, the foregoing description of exemplary embodiments will reveal the general nature of the presently disclosed systems, methods, and/or apparatuses, such that others may, by applying current knowledge, change, vary, modify, and/or adapt these exemplary, non-limiting embodiments for various applications without departing from the spirit and scope of the presently disclosed systems, methods, and/or apparatuses and elements or methods similar or equivalent to those described herein can be used in practicing the presently disclosed systems, methods, and/or apparatuses. Any and all such changes, variations, modifications, and/or adaptations should and are intended to be comprehended within the meaning and range of equivalents of the disclosed exemplary embodiments and may optionally be substituted without departing from the true spirit and scope of the presently disclosed systems, methods, and/or apparatuses.

Also, it is noted that as used herein and in the appended claims, the singular forms "a", "and", "said", and "the" include plural referents unless the context clearly dictates otherwise. Conversely, it is contemplated that the claims may be so-drafted to require singular elements or exclude any optional element indicated to be so here in the text or drawings. This statement is intended to serve as antecedent basis for use of such exclusive terminology as "solely", "only", and the like in connection with the recitation of claim elements or the use of a "negative" claim limitation(s).

What is claimed is:

1. An image offsetting apparatus for producing an offset image pathway and presenting said offset image pathway to an optical targeting device, comprising:
    a mirror assembly wherein said mirror assembly comprises a first component mirror and a second component mirror, wherein said mirror assembly is attached or coupled between said target object and said optical targeting device so as to provide said offset image pathway that is offset from a direct image pathway between a target object and said optical targeting device.

2. The image offsetting apparatus of claim 1, wherein said offset image pathway is provided within a plane that is substantially horizontally offset from said direct image pathway.

3. The image offsetting apparatus of claim 1, wherein a barrel does not intercept said offset image pathway between said target object and said optical targeting device.

4. The image offsetting apparatus of claim 1, wherein heat radiating from a barrel or a forward mounted accessory does not intercept said offset image pathway between said target object and said optical targeting device.

5. The image offsetting apparatus of claim 1, wherein said image offsetting apparatus further comprises one or more lenses aligned with said first component mirror and/or said second component mirror.

6. An image offsetting apparatus for producing an offset image pathway for a target image of a target and providing said offset target image to an optical targeting device, comprising:
    a housing having an optical cavity formed therein, wherein said optical cavity extends from an incoming image aperture formed through a first portion of said housing to an outgoing image aperture formed through a second portion of said housing, wherein said housing is positionable between said optical targeting device and a target;
    at least one first rotationally adjustable component mirror rotatably positioned within at least a portion of said optical cavity; and
    at least one second rotationally adjustable component mirror rotatably positioned within at least a portion of said optical cavity, wherein a reflective surface of said at least one first rotationally adjustable component mirror is positioned so as to receive said target image through said incoming image aperture and reflect said target image to a reflective surface of said at least one second rotationally adjustable component mirror, and wherein said reflective surface of said at least one second rotationally adjustable component mirror is positioned so as to receive said target image from said reflective surface of said at least one first rotationally adjustable component mirror and reflect said target image through said outgoing image aperture, such that said target image entering said incoming image aperture exits said outgoing image aperture at a determined offset that is offset from and at least substantially parallel to a direct image pathway from said target to said optical targeting device.

7. The image offsetting apparatus of claim 6, wherein a first adjustment knob is attached or coupled to said at least one first rotatably adjustable component mirror and wherein rotational movement of said first adjustment knob results in rotational movement of said at least one first rotatably adjustable component mirror.

8. The image offsetting apparatus of claim 6, wherein a second adjustment knob is attached or coupled to said at least one second rotatably adjustable component mirror and wherein rotational movement of said second adjustment knob results in rotational movement of said at least one second rotatably adjustable component mirror.

9. The image offsetting apparatus of claim 6, wherein rotational adjustment of said at least one first rotationally adjustable component mirror adjusts an angle at which said target image is reflected through said outgoing image aperture.

10. The image offsetting apparatus of claim 6, wherein rotational adjustment of said at least one second rotationally adjustable component mirror adjusts an angle at which said target image is reflected through said outgoing image aperture.

11. The image offsetting apparatus of claim 6, wherein said at least one first rotationally adjustable component mirror is attached or coupled to a first adjustable mirror holder.

12. The image offsetting apparatus of claim 6, wherein said at least one second rotationally adjustable component mirror is attached or coupled to a second adjustable mirror holder.

13. The image offsetting apparatus of claim 6, wherein said at least one first rotationally adjustable component mirror is a plane mirror.

14. The image offsetting apparatus of claim 6, wherein said at least one second rotationally adjustable component mirror is a plane mirror.

15. The image offsetting apparatus of claim 6, wherein said at least one first rotationally adjustable component mirror is a magnifying mirror.

16. The image offsetting apparatus of claim 6, wherein said at least one second rotationally adjustable component mirror is a magnifying mirror.

17. The image offsetting apparatus of claim 6, wherein said image offsetting apparatus is positioned between said optical targeting device and said target.

18. The image offsetting apparatus of claim 6, wherein said offset image pathway is offset from a longitudinal axis of said optical targeting device and offset from a vertical plane formed between said longitudinal axis of said optical targeting device and a longitudinal axis of a barrel of a firearm to which said optical targeting device and said image offsetting apparatus are attached or coupled.

19. An image offsetting apparatus for producing an offset image pathway for a target image of a target and providing said offset target image to an optical targeting device, comprising:
- a housing having an optical cavity formed therein, wherein said optical cavity extends from an incoming image aperture formed through a first portion of said housing to an outgoing image aperture formed through a second portion of said housing, wherein said housing is positionable between said optical targeting device and a target; and
- a mirror assembly positioned within at least a portion of said optical cavity, wherein said mirror assembly receives said target image through said incoming image aperture and reflects said target image through said outgoing image aperture, such that said target image entering said incoming image aperture exits said outgoing image aperture at a determined offset that is offset from and at least substantially parallel to a direct image pathway from said target to said optical targeting device, and wherein said offset image pathway is offset from a longitudinal axis of said optical targeting device and offset from a vertical plane formed between said longitudinal axis of said optical targeting device and a longitudinal axis of a barrel of a firearm to which said optical targeting device and said image offsetting apparatus are attached or coupled.

20. The image offsetting apparatus of claim 19, wherein said mirror assembly comprises at least one first rotatably adjustable component mirror and at least one second rotationally adjustable component mirror.

* * * * *